United States Patent
Tokuda et al.

(10) Patent No.: US 9,331,134 B2
(45) Date of Patent: May 3, 2016

(54) ORGANIC ELECTROLUMINESCENCE DISPLAY DEVICE

(71) Applicant: Japan Display Inc., Tokyo (JP)

(72) Inventors: Naoki Tokuda, Tokyo (JP); Mitsuhide Miyamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/221,315

(22) Filed: Mar. 21, 2014

(65) Prior Publication Data

US 2014/0284579 A1    Sep. 25, 2014

(30) Foreign Application Priority Data

Mar. 22, 2013 (JP) ................. 2013-060352

(51) Int. Cl.
*H01L 35/24* (2006.01)
*H01L 27/32* (2006.01)
*H01L 27/12* (2006.01)

(52) U.S. Cl.
CPC .......... *H01L 27/3276* (2013.01); *H01L 27/124* (2013.01); *H01L 27/1255* (2013.01); *H01L 27/3265* (2013.01)

(58) Field of Classification Search
CPC .................................................. H01L 27/326

USPC ............................................ 257/40, E51.001
See application file for complete search history.

(56) References Cited

FOREIGN PATENT DOCUMENTS

| JP | 2012-109030 | 6/2012 |
|---|---|---|
| KR | 10-2005-0111922 A | 11/2005 |
| KR | 10-2008-0080608 A | 9/2008 |

OTHER PUBLICATIONS

Office Action dated on Feb. 23, 2015 regarding a counterpart Korean patent application No. 10-2014-0032284.

*Primary Examiner* — Anthony Ho
(74) *Attorney, Agent, or Firm* — Typha IP LLC

(57) ABSTRACT

An organic EL display device has a pixel electrode and a common electrode, a first insulating layer that covers a thin-film transistor, a first wire provided on the first insulating layer to electrically connect the thin-film transistor and the pixel electrode, a second wire provided on the first insulating layer to be connected to a gate electrode of the thin-film transistor, and a conducting film formed on the first wire and the second wire from a material on which an oxide film is harder to be formed than those of the first wire and the second wire. At least one of the pixel electrode, the first wire, and the second wire and the conducting film are located to overlap above the first insulating layer in electrical insulation so that a capacitor that retains a control signal is formed between the first wire and the second wire.

15 Claims, 5 Drawing Sheets

ORGANIC ELECTROLUMINESCENCE DISPLAY DEVICE

CROSS-REFERENCE TO RELATED APPLICATION

The present application claims priority from Japanese application JP2013-60352 filed on Mar. 22, 2013, the content of which is hereby incorporated by reference into this application.

BACKGROUND OF THE INVENTION

1. Field of the Invention

This invention relates to an organic electroluminescence display device.

2. Description of the Related Art

An organic electroluminescence display device has a structure in which an organic layer and a sealing layer are stacked on a circuit board (JP 2012-109030 A). On the circuit board, a circuit containing active elements including thin-film transistors, passive elements including resistors and capacitors, electrodes, wires, etc. is formed. The circuit is formed by deposition and etching of conducting films, insulating films, and semiconductor films.

A displayed image includes a plurality of pixels and capacitors for holding signals entering from data lines are formed with respect to each pixel. The capacitors have been formed in the same layer as the thin-film transistors, however, their formation area is narrower in response to the higher definition and the formation becomes harder.

SUMMARY OF THE INVENTION

An object of the invention is to form capacitors without adding any new layer or forming step.

(1) An organic electroluminescence display device according to the invention includes an organic electroluminescence layer, a pixel electrode and a common electrode stacked to sandwich the organic electroluminescence layer, a thin-film transistor, a first insulating layer that covers a semiconductor layer and a gate electrode of the thin-film transistor, a current supply line electrically connected to one of a source electrode and a drain electrode of the thin-film transistor, a first wire provided on the first insulating layer to electrically connect the other of the source electrode and the drain electrode of the thin-film transistor and the pixel electrode, a second wire provided on the first insulating layer to be connected to the gate electrode of the thin-film transistor, a data line for transmitting a control signal to the gate electrode of the thin-film transistor via the second wire, a conducting film formed on the first wire and the second wire from a material on which an oxide film is harder to be formed than those of the first wire and the second wire, and a second insulating layer formed on the conducting film and under the pixel electrode, wherein at least one of the pixel electrode, the first wire, and the second wire and the conducting film are located to overlap above the first insulating layer in electrical insulation so that a capacitor that retains the control signal may be formed between the first wire and the second wire. According to the invention, the capacitor is formed above the first insulating layer located upper than the thin-film transistor, and the capacitor can be formed even when the thin-film transistor occupies a wider region. Further, the capacitor is formed by superimposing at least one of the pixel electrode, the first wire, and the second wire and the conducting film in electrical insulation, and thereby, it is not necessary to add any new layer or forming step.

(2) In the organic electroluminescence display device according to (1), the conducting film may include a first conducting film part electrically connected to the first wire and a second conducting film part separated from the first conducting film part and electrically connected to the second wire, the pixel electrode may be electrically connected to the first wire via the first conducting film part, and the pixel electrode may overlap with the second conducting film part via the second insulating layer and form the capacitor between the pixel electrode and the second conducting film part.

(3) In the organic electroluminescence display device according to (2), the second conducting film part may be formed to avoid a position overlapping with the second wire and extend on the first insulating layer, and the pixel electrode may be provided to avoid overlapping with the second wire in a direction perpendicular to a surface of the first insulating layer.

(4) In the organic electroluminescence display device according to (3), the first conducting film part and the second conducting film part may be separated in positions avoiding overlapping with the first wire or the second wire.

(5) In the organic electroluminescence display device according to (1), a third insulating layer intervening between the first wire and the conducting film and between the second wire and the conducting film is further provided, and the third insulating layer may have a through hole on the first wire, the conducting film may continuously have a first conducting film part overlapping with the first wire and a second conducting film part overlapping with the second wire, and the first conducting film part may be electrically connected to the first wire via the through hole of the third insulating layer, and the second wire may overlap with the second conducting film part via the third insulating layer and form the capacitor between the second wire and the second conducting film part.

(6) In the organic electroluminescence display device according to (5), the pixel electrode may be formed to overlap with at least a part of the second wire.

(7) In the organic electroluminescence display device according to (1), a third insulating layer intervening between the first wire and the conducting film and between the second wire and the conducting film is further provided, and the third insulating layer may have a first through hole on the first wire and a second through hole on the second wire, the conducting film may include a first conducting film part electrically connected to the first wire via the first through hole of the third insulating layer and a second conducting film part, separated from the first conducting film part, electrically connected to the second wire via the second through hole of the third insulating layer and extending to above the first wire, and the first wire may overlap with the second conducting film part via the third insulating layer and form the capacitor between the first wire and the second conducting film part.

(8) In the organic electroluminescence display device according to (7), the pixel electrode may overlap with the second conducting film part via the second insulating layer and also form the capacitor between the pixel electrode and the second conducting film part.

(9) In the organic electroluminescence display device according to (8), the pixel electrode may be formed to overlap with at least a part of the first wire.

(10) In the organic electroluminescence display device according to any one of (1) to (9), a terminal is further provided on the first insulating layer, and the conducting film may be formed on the terminal.

(11) In the organic electroluminescence display device according to any one of (5) to (9), a terminal is further provided on the first insulating layer, and the third insulating layer may be formed on the terminal and have a through hole that exposes a part of the terminal, and the conducting film may be formed on the exposed part of the terminal from the third insulating layer.

(12) In the organic electroluminescence display device according to (10) or (11), the second insulating layer may be formed on the terminal and have an opening that exposes a part of the conducting film above the terminal.

DETAILED DESCRIPTION OF THE INVENTION

As below, embodiments of the invention will be explained with reference to the drawings.

First Embodiment

Figure 1:
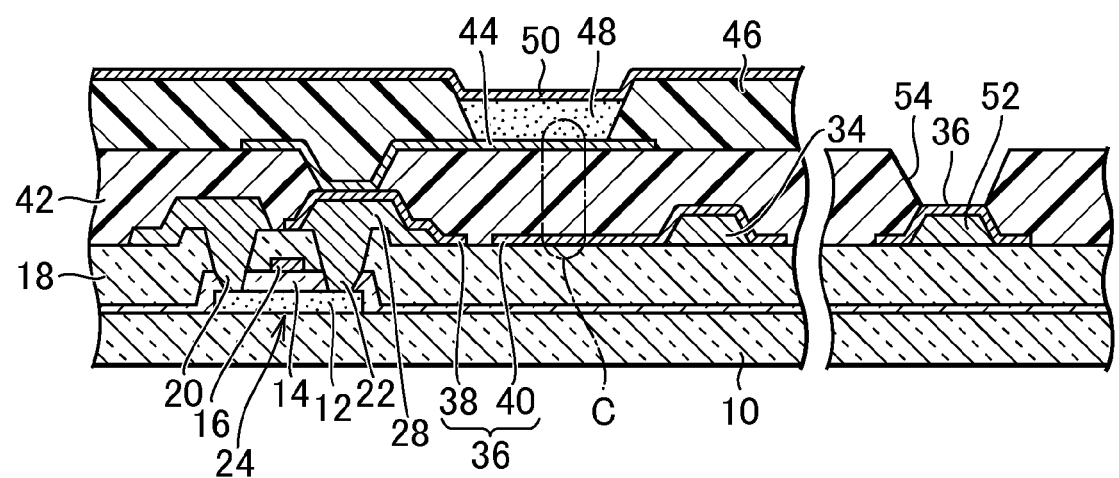
FIG. 1 is a sectional view of an organic electroluminescence display device according to a first embodiment of the invention.

FIG. 1 is a sectional view of an organic electroluminescence display device according to a first embodiment of the invention. The organic electroluminescence display device has a substrate 10 of glass or the like. A semiconductor layer 12 is formed on the substrate 10. A gate insulating film 14 is formed to cover the semiconductor layer 12. A gate electrode 16 is formed on the gate insulating film 14, and a first insulating layer 18 is formed to cover the semiconductor layer 12 and the gate electrode 16. A source electrode 20 and a drain electrode 22 are provided to penetrate the first insulating layer 18 and reach the semiconductor layer 12. The semiconductor layer 12, the source electrode 20, the drain electrode 22, and the gate electrode 16 are component elements of a thin-film transistor 24.

Figure 2:
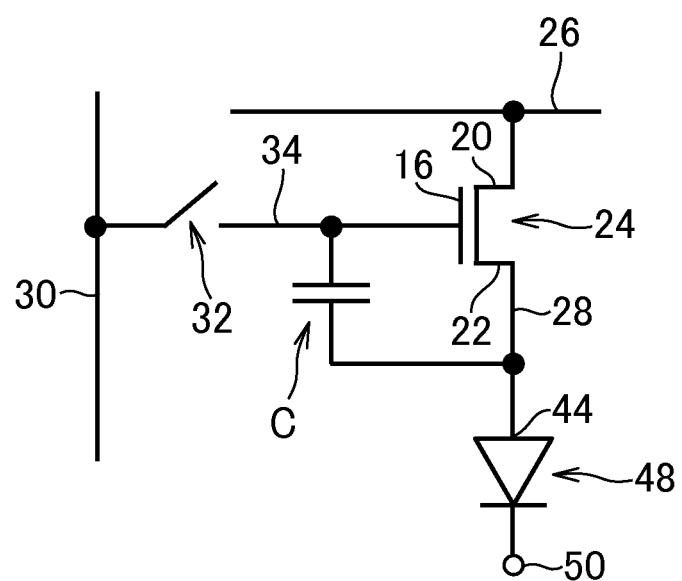
FIG. 2 is a circuit diagram of the organic electroluminescence display device shown in FIG. 1.

FIG. 2 is a circuit diagram of the organic electroluminescence display device shown in FIG. 1. A current supply line 26 is electrically connected to one of the source electrode 20 and the drain electrode 22 of the thin-film transistor 24. Further, the other of the source electrode 20 and the drain electrode 22 is electrically connected to a first wire 28. In FIG. 1, the other of the source electrode 20 and the drain electrode 22 is integrally formed with the first wire 28. The first wire 28 is provided on the first insulating layer 18.

The gate electrode 16 of the thin-film transistor 24 is electrically connected to a data line 30 as shown in FIG. 2, and, when a switching element 32 is turned on, a control signal is input via the data line 30. The data line 30 and the gate electrode 16 are electrically connected via a second wire 34. The second wire 34 is provided on the first insulating layer 18 as shown in FIG. 1.

As shown in FIG. 1, a conducting film 36 is formed on the first wire 28 and the second wire 34 and the conducting film 36 comprises a material which has a property that an oxidation rate at the surface of the material is less than an oxidation rate at the surface of materials of the first wire 28 and the second wire 34. For example, when the first wire 28 and the second wire 34 are formed from a metal such as aluminum or copper, the conducting film 36 is formed from an oxide semiconductor such as indium tin oxide.

The conducting film 36 includes a first conducting film part 38 electrically connected to the first wire 28. At least a part or only a part of the first conducting film part 38 is in contact with the first wire 28. The conducting film 36 includes a second conducting film part 40 separated from the first conducting film part 38 and electrically connected to the second wire 34. At least a part or only a part of the second conducting film part 40 is in contact with the second wire 34. The first conducting film part 38 and the second conducting film part 40 are located in positions avoiding overlapping with the first wire 28 or the second wire 34 (e.g., on the first insulating layer 18) with a gap between their ends, and thereby, separated. The second conducting film part 40 extends on the first insulating layer 18 to avoid a position overlapping (or in contact) with the second wire 34. A second insulating layer 42 is formed on the first insulating layer 18. The second insulating layer 42 covers the source electrode 20 and the drain electrode 22. The second insulating layer 42 is located on the conducting film 36.

A pixel electrode 44 (e.g., anode) is provided on the second insulating layer 42. The pixel electrode 44 is formed to contain a light reflection film. Or, the pixel electrode 44 may have a layered structure of the light reflection film and a transparent conducting film. The pixel electrode 44 penetrates the second insulating layer 42 and is connected to the first conducting film part 38, and electrically connected to the first wire 28 via the first conducting film part 38. Therefore, as shown in FIG. 2, a current is supplied from the current supply line 26 to the pixel electrode 44 via the first wire 28. Note that the pixel electrode 44 avoids overlapping with the second wire 34 in a direction perpendicular to the surface of the first insulating layer 18.

A bank 46 is provided from an insulating material such as resin to surround at least the center part of each pixel electrode 44. An organic electroluminescence layer 48 is formed on the pixel electrode 44 surrounded by the bank 46. The organic electroluminescence layer 48 contains at least a light emitting layer and further contains at least one layer of an electron transport layer, a hole transport layer, an electron injection layer, and a hole injection layer. The at least one layer forming the organic electroluminescence layer 48 is formed from an organic material. The organic electroluminescence layer 48 is formed by evaporation or sputtering.

A light-transmissive common electrode 50 (e.g., cathode) is formed from the organic electroluminescence layer 48 to the bank 46 thereon. The common electrode 50 is formed to cover the entire of all pixel electrodes 44. The organic electroluminescence layer 48 is sandwiched between the pixel electrode 44 and the common electrode 50. A voltage is applied to the pixel electrode 44 and the common electrode 50, and thereby, holes and electrons are injected from the respective electrodes into the organic electroluminescence layer 48. The injected holes and electrons are coupled in the light emitting layer and emit light.

A terminal 52 is provided on the first insulating layer 18. The conducting film 36 is formed on the terminal 52. The second insulating layer 42 is provided on the terminal 52 with an opening 54 exposing a part of the conducting film 36 above the terminal 52. The part of the conducting film 36 covering the terminal 52 is exposed via the opening 54 so that electrical connection to the outside may be obtained. The terminal 52 is covered by the conducting film 36, and thereby, the oxide film is harder to be formed thereon.

At least one of the pixel electrode 44, the first wire 28, and the second wire 34 and the conducting film 36 are located to overlap in electrical insulation. In the example of FIG. 1, the pixel electrode 44 and the second conducting film part 40 overlap and the second insulating layer 42 intervenes between them. Therefore, a capacitor C is formed between the pixel electrode 44 and the second conducting film part 40. The pixel electrode 44 is electrically connected to the first wire 28 and the second conducting film part 40 is electrically connected to the second wire 34, and thereby, the capacitor C is formed between the first wire 28 and the second wire 34. The capacitor C is a retention capacity because the control signal input from the data line 30 is retained as shown in FIG. 2. The thin-film transistor 24 is held on by the control signal retained in the capacitor C.

According to the embodiment, the pixel electrode 44, the first wire 28, the second wire 34, and the conducting film 36 are located above the first insulating layer 18. Therefore, the capacitor C is formed above the first insulating layer 18 located upper than the thin-film transistor 24, and the capacitor C can be formed even when the thin-film transistor 24 occupies a wider region. The capacitor C is formed by superimposing at least one of the pixel electrode 44, the first wire 28, and the second wire 34 and the conducting film 36 in electrical insulation, and thereby, it is not necessary to add any new layer or forming step.

Figure 3:
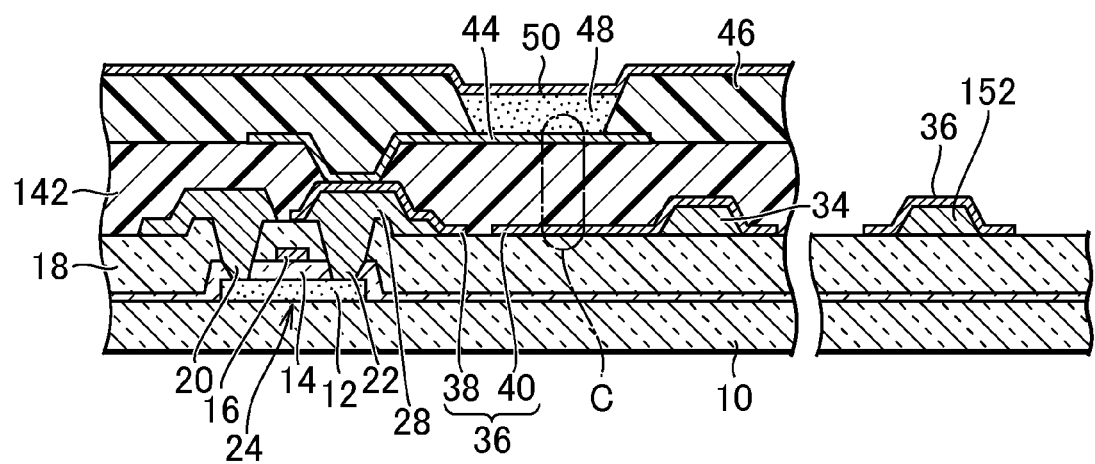
FIG. 3 is a sectional view of an organic electroluminescence display device according to a modified example of the first embodiment of the invention.

FIG. 3 is a sectional view of an organic electroluminescence display device according to a modified example of the first embodiment of the invention. This example is different from the example in FIG. 1 in that a second insulating layer 142 is provided not on a terminal 152, and the description of the first embodiment corresponds to the rest of the configuration.

Second Embodiment

Figure 4:
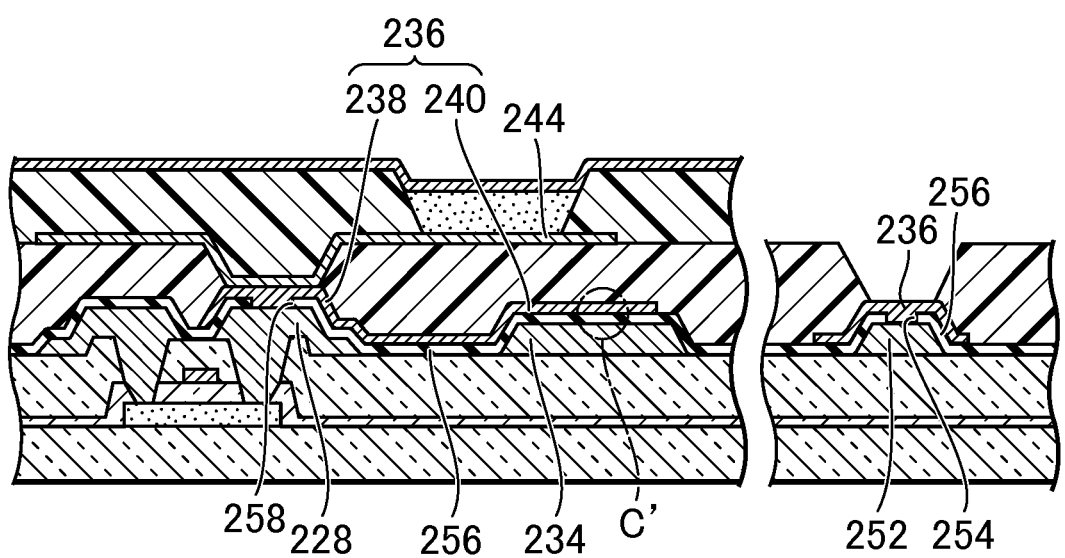
FIG. 4 is a sectional view of an organic electroluminescence display device according to a second embodiment of the invention.

FIG. 4 is a sectional view of an organic electroluminescence display device according to a second embodiment of the invention.

In the embodiment, a third insulating layer 256 is provided on a first wire 228 and a second wire 234. A conducting film 236 is formed on the third insulating layer 256. The conducting film 236 continuously has a first conducting film part 238 overlapping with the first wire 228 and a second conducting film part 240 overlapping with the second wire 234. The third insulating layer 256 intervenes between the first wire 228 and the first conducting film part 238 and between the second wire 234 and the second conducting film part 240.

The third insulating layer 256 has a through hole 258 on the first wire 228. The first conducting film part 238 is electrically connected to the first wire 228 via the through hole 258 of the third insulating layer 256. On the other hand, the third insulating layer 256 has no through hole on the second wire 234, and the second conducting film part 240 and the second wire 234 are electrically insulated.

The second wire 234 overlaps with the second conducting film part 240 via the third insulating layer 256. The second conducting film part 240 is integrated with the first conducting film part 238 and electrically connected to the first wire 228, but insulated from the second wire 234. Therefore, a capacitor C' is formed between the second wire 234 and the second conducting film part 240. The capacitor C' is a retention capacity in which the control signal input from the data line 30 is retained between the first wire 228 and the second wire 234 like the capacitor C shown in FIG. 2.

The description of the first embodiment corresponds to the rest of the configuration of the embodiment. Note that, in the example of FIG. 4, unlike the example of FIG. 1, a pixel electrode 244 is formed to overlap with at least a part of the second wire 234. Further, the third insulating layer 256 intervenes between a terminal 252 and the conducting film 236, and an opening 254 is formed above the terminal 252 in the third insulating layer 256 so that electrical connection between the terminal 252 and the conducting film 236 may be obtained.

Third Embodiment

Figure 5:
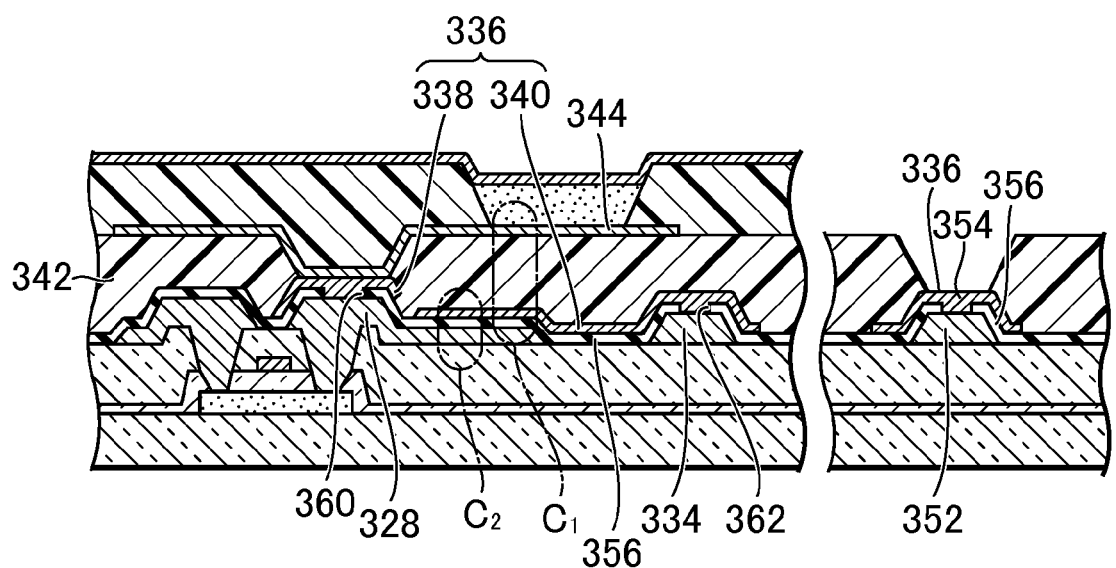
FIG. 5 is a sectional view of an organic electroluminescence display device according to a third embodiment of the invention.

FIG. 5 is a sectional view of an organic electroluminescence display device according to a third embodiment of the invention.

In the embodiment, a third insulating layer 356 is provided on a first wire 328 and a second wire 334. A conducting film 336 is formed on the third insulating layer 356. That is, the third insulating layer 356 intervenes between the first wire 328 and the conducting film 336 and between the second wire 334 and the conducting film 336.

The conducting film 336 contains a first conducting film part 338 overlapping with the first wire 328 via the third insulating layer 356. The first conducting film part 338 is provided to avoid a part of the first wire 328 above the rest of the region. The third insulating layer 356 has a first through hole 360 on the first wire 328. The first conducting film part 338 is electrically connected to the first wire 328 via the first through hole 360 of the third insulating layer 356.

The conducting film 336 contains a second conducting film part 340 electrically connected to the second wire 334. The second conducting film part 340 overlaps with the second wire 334 via the third insulating layer 356. The third insulating layer 356 has a second through hole 362 on the second wire 334. The second conducting film part 340 is electrically connected to the second wire 334 via the second through hole 362 of the third insulating layer 356.

The second conducting film part 340 extends to above the first wire 328. A part of the second conducting film part 340 is located in the region without the first conducting film part 338 above the first wire 328. Note that the second conducting film part 340 is separated from the first conducting film part 338. In the example of FIG. 5, there is a gap between the first conducting film part 338 and the second conducting film part 340 above the first wire 328.

The pixel electrode 344 is electrically connected to (in the example of FIG. 5, in contact with) the first conducting film part 338, and electrically connected to the first wire 328 via the first conducting film part 338. The pixel electrode 344 overlaps with at least a part of the first wire 328, and further overlaps with at least a part of the second wire 334 in the example of FIG. 5.

The pixel electrode 344 overlaps with the second conducting film part 340 via a second insulating layer 342. Therefore, a capacitor $C_1$ is formed between the pixel electrode 344 and the second conducting film part 340. In other words, the pixel electrode 344 is electrically connected to the first wire 328 and the second conducting film part 340 is electrically connected to the second wire 334, and thereby, the capacitor $C_1$ that retains the control signal is formed between the first wire 328 and the second wire 334.

The first wire 328 overlaps with the second conducting film part 340 via the third insulating layer 356. Therefore, a capacitor $C_2$ is formed between the first wire 328 and the second conducting film part 340. In other words, the second conducting film part 340 is electrically connected to the second wire 334, and thereby, the capacitor $C_2$ that retains the control signal is formed between the first wire 328 and the second wire 334.

In the embodiment, the third insulating layer 356 is formed on the terminal 352 with an opening 354 exposing a part of the terminal 352. The conducting film 336 is formed on the exposed part of the terminal 352 from the third insulating layer 356. The description of the first embodiment corresponds to the rest of the configuration of the embodiment.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device comprising:
    an organic electroluminescence layer;
    a pixel electrode and a common electrode stacked to sandwich the organic electroluminescence layer;
    a thin-film transistor;
    a first insulating layer that covers a semiconductor layer and a gate electrode of the thin-film transistor;
    a current supply line electrically connected to one of a source electrode and a drain electrode of the thin-film transistor;
    a first wire provided on the first insulating layer to electrically connect another of the source electrode and the drain electrode of the thin-film transistor which is not electrically connected to the current supply line, and the pixel electrode, wherein the first wire comprises a first material;
    a second wire provided on the first insulating layer to be electrically connected to the gate electrode of the thin-film transistor, wherein the second wire comprise the first material;
    a data line for transmitting a control signal to the gate electrode of the thin-film transistor via the second wire;
    a conducting film formed on the first wire and the second wire, wherein the conducting film comprises a second material, and an oxidation rate of the second material is less than an oxidation rate of the first material; and
    a second insulating layer formed on the conducting film and under the pixel electrode,
    wherein the conducting film and at least one of the pixel electrode, the first wire or the second wire are located to overlap above the first insulating layer in electrical insulation so that a capacitor that retains the control signal is formed between the first wire and the second wire.

2. The organic electroluminescence display device according to claim 1, wherein the conductive film includes a first conducting film part electrically connected to the first wire and a second conducting film part separated from the first conductive film part and electrically connected to the second wire,
    the pixel electrode is electrically connected to the first wire via the first conducting film part, and
    the pixel electrode overlaps with the second conducting film part via the second insulating layer and forms the capacitor between the pixel electrode and the second conducting film part.

3. The organic electroluminescence display device according to claim 2, wherein the second conducting film part is formed to avoid a position overlapping with the second wire and extend on the first insulating layer, and
    the pixel electrode is provided to avoid overlapping with the second wire in a direction perpendicular to a surface of the first insulating layer.

4. The organic electroluminescence display device according to claim 3, wherein the first conducting film part and the second conducting film part are separated in positions avoiding overlapping with the first wire or the second wire.

5. The organic electroluminescence display device according to claim 1, further comprising a third insulating layer intervening between the first wire and the conductive film and between the second wire and the conducting film,
    wherein the third insulating layer has a through hole on the first wire,
    the conducting film continuously has a first conducting film part overlapping with the first wire and a second conducting film part overlapping with the second wire, and the first conducting film part is electrically connected to the first wire via the through hole of the third insulating layer, and
    the second wire overlaps with the second conducting film part via the third insulating layer and forms the capacitor between the second wire and the second conducting film part.

6. The organic electroluminescence display device according to claim 5, wherein the pixel electrode is formed to overlap with at least a part of the second wire.

7. The organic electroluminescence display device according to claim 1, further comprising a third insulating layer intervening between the first wire and the conducting film and between the second wire and the conducting film,
    wherein the third insulating layer has a first through hole on the first wire and a second through hole on the second wire,
    the conducting film includes a first conducting film part electrically connected to the first wire via the first through hole of the third insulating layer and a second conducting film part, separated from the first conducting film part, electrically connected to the second wire via the second through hole of the third insulating layer and extending to above the first wire, and
    the first wire overlaps with the second conducting film part via the third insulating layer and forms the capacitor between the first wire and the second conducting film part.

8. The organic electroluminescence display device according to claim 7, wherein the pixel electrode overlaps with the second conducting film part via the second insulating layer and also forms the capacitor between the pixel electrode and the second conducting film part.

9. The organic electroluminescence display device according to claim 8, wherein the pixel electrode is formed to overlap with at least a part of the first wire.

10. The organic electroluminescence display device according to claim 1, further comprising a terminal provided on the first insulating layer,
    wherein the conducting film is formed on the terminal.

11. The organic electroluminescence display device according to claim 5, further comprising a terminal provided on the first insulating layer, wherein the third insulating layer is formed on the terminal and has a through hole that exposes a part of the terminal, and the conducting film is formed on the exposed part of the terminal from the third insulating layer.

12. The organic electroluminescence display device according to claim 7, further comprising a terminal provided on the first insulating layer, wherein the third insulating layer is formed on the terminal and has a through hole that exposes a part of the terminal, and the conducting film is formed on the exposed part of the terminal from the third insulating layer.

13. The organic electroluminescence display device according to claim 10, wherein the second insulating layer is formed on the terminal and has an opening that exposes a part of the conducting film above the terminal.

14. The organic electroluminescence display device according to claim 11, wherein the second insulating layer is formed on the terminal and has an opening that exposes a part of the conducting film above the terminal.

15. The organic electroluminescence display device according to claim 12, wherein the second insulating layer is formed on the terminal and has an opening that exposes a part of the conducting film above the terminal.

* * * * *